(12) United States Patent
Chainer et al.

(10) Patent No.: US 10,194,522 B2
(45) Date of Patent: Jan. 29, 2019

(54) THERMAL INTERFACE SOLUTION WITH REDUCED ADHESION FORCE

(71) Applicant: International Business Machines Corporation

(72) Inventors: Timothy J. Chainer, Armonk, NY (US); Michael Gaynes, Armonk, NY (US)

(73) Assignee: International Business Machines Corporation, Armonk, NY (US)

( * ) Notice: Subject to any disclaimer, the term of this patent is extended or adjusted under 35 U.S.C. 154(b) by 110 days.

(21) Appl. No.: 15/443,946

(22) Filed: Feb. 27, 2017

(65) Prior Publication Data

US 2017/0181267 A1 Jun. 22, 2017

Related U.S. Application Data

(63) Continuation of application No. 14/299,547, filed on Jun. 9, 2014.

(51) Int. Cl.
*H05K 1/02* (2006.01)
*H01L 23/373* (2006.01)
(Continued)

(52) U.S. Cl.
CPC .......... *H05K 1/0204* (2013.01); *B32B 3/266* (2013.01); *B32B 7/14* (2013.01); *B32B 37/1292* (2013.01); *H01L 21/4871* (2013.01); *H01L 23/373* (2013.01); *H01L 23/49838* (2013.01); *B32B 2037/1253* (2013.01); *B32B 2250/03* (2013.01);
(Continued)

(58) Field of Classification Search
CPC ............ H05K 1/0204; H05K 2201/066; B32B 3/266; B32B 7/14; B32B 37/12952; B32B 2037/1253; B32B 2250/03; B32B 2255/26; B32B 2307/302; B32B 2457/08; B32B 2457/14; H01L 21/4871; H01L 23/373; H01L 23/49838
See application file for complete search history.

(56) References Cited

U.S. PATENT DOCUMENTS 4,151,547 A 4/1979 Rhoades et al.
5,783,862 A 7/1998 Deeney
(Continued)

OTHER PUBLICATIONS

U.S. Appl. No. 14/040,704, filed Sep. 29, 2013, Intl. Bus. Mach. Corp.

*Primary Examiner* — Peter Bradford

(57) ABSTRACT

A method comprises applying an adhesive to a first substrate and a second substrate to secure the first substrate to the second substrate. The adhesive extends in a plane on one side of an interposer that also extends in the plane, and is contiguous with the adhesive. The interposer comprises openings to enable flow of adhesive through the openings to form adhesive bond areas on one of the substrates where the areas substantially conform to the openings and lie adjacent to adhesive free areas. The adhesive substantially covers the other of the substrates so that the bond areas produce regions of reduced adhesive strength to the one substrate compared to the bond strength of the adhesive to the other substrate. Adjusting opening sizes adjusts area bond strengths. One substrate may comprise a VTM, the other a heat spreader, and the adhesive, a TIM. An article of manufacture comprises the substrate-adhesive-interposer-adhesive-substrate layers.

14 Claims, 4 Drawing Sheets

(51) Int. Cl.
  *H01L 23/498* (2006.01)
  *H01L 21/48* (2006.01)
  *B32B 37/12* (2006.01)
  *B32B 7/14* (2006.01)
  *B32B 3/26* (2006.01)

(52) U.S. Cl.
  CPC ..... *B32B 2255/26* (2013.01); *B32B 2307/302* (2013.01); *B32B 2457/08* (2013.01); *B32B 2457/14* (2013.01); *H05K 2201/066* (2013.01)

(56) References Cited

U.S. PATENT DOCUMENTS

| | | |
|---|---|---|
| 6,050,832 A | 4/2000 | Lee et al. |
| 6,275,381 B1 | 8/2001 | Edwards et al. |
| 6,523,608 B1 | 2/2003 | Solbrekken et al. |
| 7,002,247 B2 | 2/2006 | Mok et al. |
| 7,646,608 B2 | 1/2010 | Thompson et al. |
| 7,688,592 B2 | 3/2010 | Gruendler et al. |
| 7,694,719 B2 | 4/2010 | Furman et al. |
| 7,738,252 B2 | 6/2010 | Schuette et al. |

THERMAL INTERFACE SOLUTION WITH REDUCED ADHESION FORCE

This application is a Continuation Application pursuant to 35 U.S.C. § 120 of Parent Application Ser. No. 14/299,547 filed: Jun. 9, 2014 which is incorporated herein by reference in its entirety, the present application also claiming the benefits of this Parent Application pursuant to 35 U.S.C. § 120.

FIELD OF THE INVENTION

The field of the invention in one aspect comprises a thermal interface structure made up of a thermal interface material ("TIM") on an interposer that controls the area of contact of the TIM to a substrate.

BACKGROUND OF THE INVENTION

The so-called "silicon revolution" brought about the development of faster and larger computers beginning in the early 1960's with predictions of rapid growth because of the increasing numbers of transistors packed into integrated circuits with estimates they would double every two years. Since 1975, however, they doubled about every 18 months.

An active period of innovation in the 1970's followed in the areas of circuit design, chip architecture, design aids, processes, tools, testing, manufacturing architecture, and manufacturing discipline. The combination of these disciplines brought about the VLSI era and the ability to mass-produce chips with 100,000 transistors per chip at the end of the 1980's, succeeding the large scale Integration ("LSI") era of the 1970's with only 1,000 transistors per chip. (Carre, H. et al. "Semiconductor Manufacturing Technology at IBM", *IBM J. RES. DEVELOP.*, VOL 26, no. 5, September 1982). Mescia et al. also describe the industrial scale manufacture of these VLSI devices. (Mescia, N. C. et al. "Plant Automation in a Structured Distributed System Environment," *IBM J. RES. DEVELOP.*, VOL 26, no. 4, July 1982).

The release of IBM's Power6™ chip in 2007, noted "miniaturization has allowed chipmakers to make chips faster by cramming more transistors on a single slice of silicon, to the point where high-end processors have hundreds of millions of transistors. But the process also tends to make chips run hotter, and engineers have been trying to figure out how to keep shrinking chips down while avoiding them frying their own circuitry." (http://www.nytimes.com/reuters/technology/tech-ibm-power.html?pagewanted=print (2/7/2006))

Technology scaling of semiconductor devices to 90 nm and below has provided many benefits in the field of microelectronics, but has introduced new considerations as well. While smaller chip geometries result in higher levels of on-chip integration and performance, higher current and power densities, increased leakage currents, and low-k dielectrics with poorer heat conductivity occur that present new challenges to package and heat dissipation designs.

CMOS power density is increasing. Recently the industry has seen it rise from 100 W/sq cm to 200 W/sq cm, beyond that of bipolar technology in the early 1990's. This increase in power density also increases the operating temperature of the device which materially interfered with proper operation of the device. The industry addressed this increase in operating temperature by securing the device to a heat exchange structure or material (i.e., heat spreader), but different coefficients of expansion of the heat spreader and the device caused structural and consequently further operating problems in the device. The difficulty was resolved for the most part by placing a TIM between the two that not only joined them in a heat exchange relation but also provided sufficient flexibility that enabled a link between the surfaces that substantially compensated for their different coefficients of expansions and substantially minimized any stress or strain placed on the device in the heat exchange process. The TIM material typically would sit underneath "contact patches," helping to thermally bridge the gap between the device being cooled and the "contact patch."

New generation servers employ more vendor technology that usually requires some level of custom integration to realize reliable performance. "VTM" (voltage transmission module) is one such technology used for power control in servers developed today. Kim, et al., U.S. Pat. Nos. 8,498,540 and 8,565,606 describe circuits used in voltage transmission module technology. The VTM requires a TIM to effectively transfer heat from an array of VTMs to a common heat spreader. Inherent in manufacturing a VTM printed circuit board (PCB) assembly is rework. Thus, the common heat spreader must be easily separable from the VTM array in order to remove and replace a failed module. The heat spreader removal process must not damage any good modules.

The VTM has fragile solder connections that can only tolerate a compressive limit of about 15 psi and about 7 psi of tensile stress. TIMs that separate at tensile stress less than 7 psi either lack compliance to accommodate the bondline tolerances as in the case of thermal pads; or, in the case of accommodating bondline tolerances, for example greases or low cross link density gels, lack positional stability and pump out due to thermal mechanical movement between the common heat spreader and large PCB with the array of modules. Curable paste, adhesive TIMs that accommodate bondline tolerances and which are mechanically stable will require tensile forces greater than 7 psi to separate and thus will damage good components.

The application requirements for thermal interface materials therefore can include both assembly (compressive) and disassembly (tensile) force requirements. As noted above, the VTM module has a compressive limit of about 15 psi and tensile limit of about 7 psi. These requirements have limited the selection of thermal interface materials in the past to only one candidate, Chomerics T636, however, the present invention allows the use of many other commercial TIM's as well as newly formulated TIM's.

The present invention proposes a method for controlling TIM force for disassembly which would meet this and all other application requirements.

RELATED ART

Schuette et al., U.S. Pat. No. 7,738,252; Furman, et al., U.S. Pat. No. 7,694,719; Gruendler et al., U.S. Pat. No. 7,688,592; Thompson et al., U.S. Pat. No. 7,646,608; Mok et al., U.S. Pat. No. 7,002,247; Solbrekken et al., U.S. Pat. No. 6,523,608; Edwards et al., U.S. Pat. No. 6,275,381; Lee et al. U.S. Pat. No. 6,050,832; Deeney, U.S. Pat. No. 5,783,862; Rhoades et al., U.S. Pat. No. 4,151,547; Hill et al. United States Patent Application Publication 2010/0321895; Pang TIM Selection Criteria for Silicon Validation Environment; 26 th IEEE SEMI-THERM Symposium 2010, pp.107 et seq. all show heat transfer devices for dissipating heat from a heat generating body.

SUMMARY OF THE INVENTION

The present invention provides structures, articles of manufacture and processes that address these needs to not only provide advantages over the related art, but also to substantially obviate one or more of the foregoing and other limitations and disadvantages of the related art by providing a thermal interface structure made up of a TIM on an interposer that controls the area of the contact surface of the TIM on a surface from which or to which heat is to be transferred.

Not only do the written description, claims, and abstract of the disclosure set forth various features, objectives, and advantages of the invention and how they may be realized and obtained, but these features, objectives, and advantages will also become apparent by practicing the invention.

BRIEF DESCRIPTION OF THE DRAWINGS

The accompanying drawings are not necessarily drawn to scale but nonetheless set out the invention, and are included to illustrate various embodiments of the invention, and together with this specification also serve to explain the principles of the invention. These drawings comprise various Figures that illustrate, inter alia structures and methods for adjusting the bonding strength of adhesives such as TIMs to substrates.

DETAILED DESCRIPTION OF THE INVENTION

To achieve the foregoing and other advantages, and in accordance with the purpose of this invention as embodied and broadly described herein, the following detailed description comprises disclosed examples of the invention that can be embodied in various forms.

The specific processes, compounds, compositions, and structural details set out herein not only comprise a basis for the claims and a basis for teaching one skilled in the art how to employ the present invention in any novel and useful way, but also provide a description of how to make and use this invention. The written description, claims, abstract of the disclosure, and the drawings that follow set forth various features, objectives, and advantages of the invention and how they may be realized and obtained. These features, objectives, and advantages will also become apparent by practicing the invention.

The invention comprises, inter alia, a process for reducing the area of contact between a thermal interface material and a module which is to be cooled. The disassembly force of a thermal adhesive is equal to the adhesive force per unit area (e.g. pounds/square inch) times the total area of contact (square inches). This invention allows control over the disassembly force to protect fragile components from damage due to separation forces. This invention provides the ability to accommodate large bondline tolerances on the order of about +/−0.5 mm or more and which are mechanically stable when using curable paste adhesive TIMs having reduced bond area.

Reducing the bond area is accomplished by using an adhesive such as a TIM known in the art, and in one embodiment, a curable or cured TIM, in combination with an interposer sheet or film, e.g., a thermally conductive interposer sheet. The interposer has holes or perforations that allow a layer of the thermal paste adhesive positioned on and above one face of the interposer to continuously bond to a heat spreader above the interposer both in areas above the perforations and in areas adjacent the perforations. The layer of the thermal paste adhesive is also made to extend through the perforations to the surface of a component (e.g., PCB) beneath the interposer to bond the heat spreader to the component as well. However, in the web area (non-perforated area) of the interposer, the thermal paste adhesive is blocked from contacting a portion of the component beneath the interposer to which it would normally bond in the absence of the interposer.

By reducing the bond area of the curable TIM below the interposer, the tensile stress to separate the heat spreader from the array of components on the PCB is lowered and controlled to below the fragility limit of the component. We therefore enable a low thermal resistance of the interposer contacting a surface by coating the interposer with the TIM, and in one embodiment an elastomeric TIM that is fully cured or curable in situ and has low or no tack. We illustrate this TIM as element 16 in FIG. 1.

Figure 1:
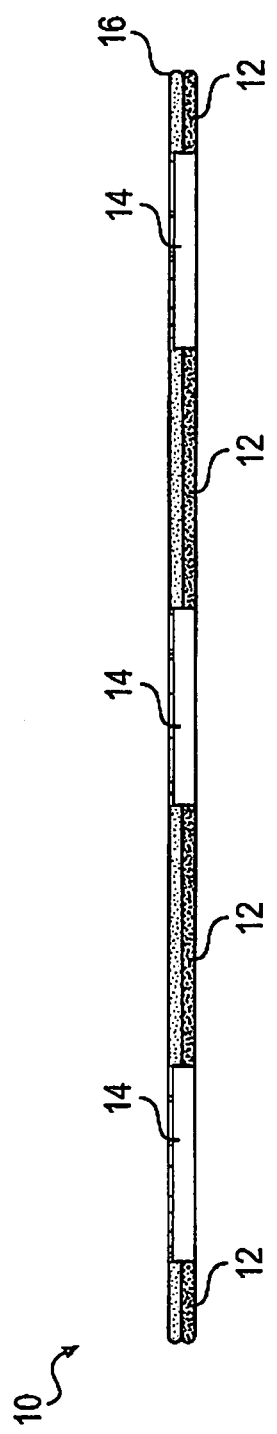
FIG. 1 and FIG. 1A illustrate an aspect of the present invention comprising a side elevation in cross-section of a perforated interposer coated with an adhesive on one side where the adhesive can extend through the openings toward the other side of the interposer.
Figure 2:
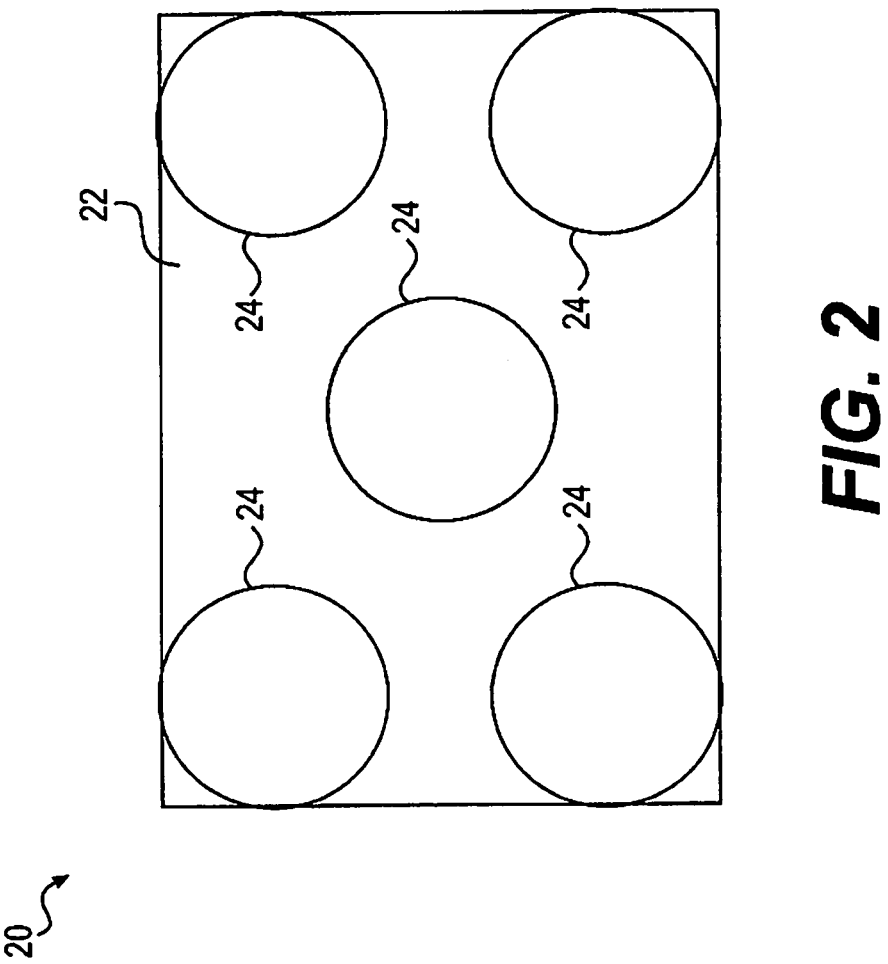
FIG. 2 Illustrates an aspect of the present invention comprising a plan view of a perforated interposer.

Although the interposer side with the TIM coating may be placed in dry contact with either the electrical device component or heat spreader surface, in the Figures, we show the interposer side with the TIM coating placed in dry contact with the heat spreader surface. Because the TIM coating is soft and compliant, the mating force used to join the heat spreader with the components will promote good thermal contact between the TIM coating and the surface to which it is mated. FIGS. 1 and 2 show a thin (0.003 inches) interposer, e.g., copper foil (12, 22 respectively) coated with a 0.003 inch thick layer of high performance curable TIM (16) that is preapplied to a first side of the interposer either as a curable paste and cured in place or, already cured thermal polymer pad with a tacky surface for adhering to the interposer.

Figure 1A:
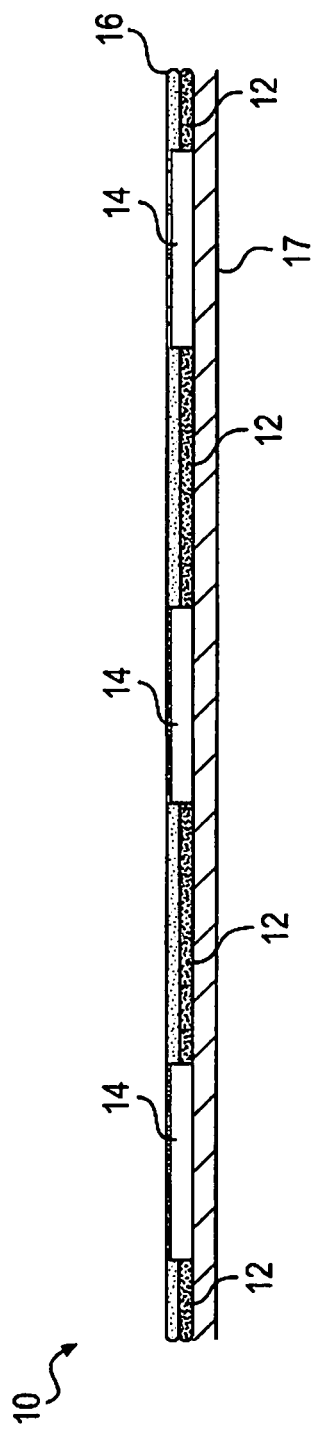

The TIM coated interposer 12, 22 is cut to the size of a typical VTM, about 22 to about 32.5 mm. Five holes, (14, 24), about 9 mm in diameter, are punched in the interposer 12, 22, i.e., we coat the 0.003 inch thick copper foil interposer (12, 22) with a high performance curable paste TIM and then add the five, 9 mm diameter holes. The surface of the interposer foil (12, 22) that is coated with TIM 16 is placed in direct contact with a VTM substrate surface. The preapplied TIM, 16, is fully cured and has low adhesion, that can range from substantially no adhesion to less than two psi in tension. As shown in FIG. 1A, we then dispense, as normal, a curable paste TIM thermal adhesive, 17 on the second side of the copper foil interposer (12, 22).

In another embodiment, we coat an interposer or metal foil (12, 22) with a TIM (16). The TIM can be either a thermal pad that has an adhesive on one side that allows it to stick to the interposer; or, it can be an adhesive paste TIM that can be applied by stencil and screen printing and then cured. In case, (thermal pad or curable paste), the resulting structure is the interposer (metal foil) with a continuous coating of TIM. Next, holes are punched in the two layer structure. The total area of the holes is the area over which a second curable TIM, 17, will bond. After the holes are punched, the two layer structure is placed on a component for example the VTM. The TIM layer, 16, is placed on the component. TIM layer, 16, has very low adhesion to the VTM because it is already completely cured. But, it is allowed that TIM layer, 16, can have some tack, enough so that it does not move when placed on the VTM. Next, as shown in FIG. 1A, the second TIM 17, a paste and curable material is dispensed over the two layer structure that is in place on the VTM.

The second TIM, 17, only contacts the VTM in the area where there are perforations or holes in the two layer structure and this is the controlled bond area that will, by design, allow tensile separation forces less that 7 psi being applied over the entire area of the VTM. After the second TIM, 17, is dispensed, the heat spreader is mated. The second TIM, 17, is a paste and therefore can accommodate a large range of bond lines with large tolerances that result from a PCB with many varieties of components that are interfaced to a common heat spreader.

Lastly, the heat spreader, (38 in FIG. 3) is mated with force over a period of time to the VTM substrate surface below. In this example, adhesion is developed to the VTM substrate surface over only 44% of its area (area of holes or perforations 14, 24) and the corresponding tensile stresses to separate the heat spreader are reduced by 56% as this is the area that is blocked by the interposer 12, 22. The reduction of the area of adhesive to one of the substrates compared to the area of the adhesive on the other substrate is substantially proportional to the reduction of adhesive strength to the substrate with the lesser amount of adhesive.

Figure 3:
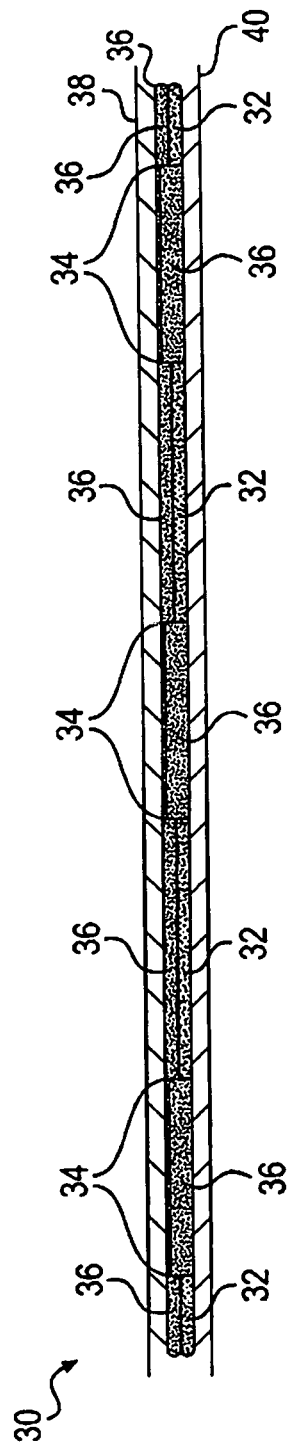
FIG. 3 illustrates an aspect of the present invention comprising a side elevation in cross-section of a perforated interposer coated with an adhesive on one side, the adhesive also extending through the perforations toward the other side of the interposer. Substrates are placed on either side of the interposer where the adhesive on one side of the interposer substantially contacts the entire face of one of the substrates, and the adhesive projecting through the perforations contacts limited areas on the other of the substrates.

FIG. 3 comprises an illustration of substrates 38 and 40 bonded to an interposer 32 having perforations 34. A high performance curable paste TIM thermal adhesive 36 extends over the top of interposer 32 to adhesively bond interposer 32 to substrate 38. Adhesive 36 also extends downward through perforations 34 and adhesively bonds to substrate 40 in adhesive areas on substrate 40 that substantiality conform to the dimensions of perforations 34 where these adhesive areas are adjacent to substantially adhesive free areas on substrate 40. Either one of substrates 38 and 40 may comprise a heat spreader and the other an electrical device such as a PCB, e.g., a VTM.

Interposer 12, 22, and 32 comprises a foil from about 0.001 inch to about 0.005 inches in thickness and can be made of any material known in the art, but especially heat conductive materials such as metals, e.g., copper, silver, gold, aluminum, titanium, tungsten and the like and alloys thereof, or carbon fibers or carbon nanotube sheets or combinations thereof, including multilayer devices that include any combination of these materials.

In one embodiment, illustrated in FIG. 3, we provide an article of manufacture comprising an adhesive 36 on a first substrate 38 and a second substrate 40. The adhesive 36 secures the first substrate to the second substrate 40, where the adhesive 36 extends in a plane on one side of an interposer 32. The interposer also extends in the plane and is contiguous with the adhesive 36. The interposer comprises openings or perforations 34 through which the adhesive 36 flows to define adhesive bond areas on the second substrate 40. The bond areas substantially conform to the openings or perforations and are adjacent to adhesive free areas. The first substrate 38 is substantially covered by the adhesive 36, so that the bond areas comprise regions of reduced adhesive strength to the second substrate 40 compared to the strength of the bond of the adhesive 36 to the first substrate 38. In other embodiments, one of the substrates may comprise a heatable substrate and the other of the substrates comprises a heat spreader substrate. The interposer may comprise a heat conductive material. One of the substrates may also comprise an electronic device such as a printed circuit board.

The adhesive includes high performance curable paste or cured TIM thermal adhesives known in the art or any other TIM material, such as greases, gels, phase change materials and the like, all of which are described by A. Gowda, et al., *Solid State Technology*, "Choosing the Right Thermal Interface Material," Volume 14, Issue 3, 2005. The present invention allows for the selection of a TIM adhesive from the many commercially available TIM adhesives since the bond strength of these adhesives to fragile substrates is now adjustable by employing the interposer of the invention.

A second embodiment is to use a thin thermal pad with low to no tack and place it on the VTM surface. Next, we dispense the second TIM, 17, on top of the thermal pad and then mate the heat spreader. The very low adhesion of the thin thermal pad will allow easy separation. The use of the second TIM, 17, a curable paste adhesive, accommodates large ranges and tolerances in bond lines that cannot be accommodated by thermal pads. While this is a much simpler solution, the benefit of the first embodiment is that by personalizing the perforations in the two layer structure, these can be located over hot spot areas and therefore a very high performance TIM can be used in the these areas and have direct contact to hot spots.

Various embodiments of the invention also comprise inter alia a method comprising applying an adhesive to a first substrate and a second substrate to secure the first substrate to the second substrate, the adhesive extending in a plane on one side of an interposer, the interposer also extending in the plane and contiguous with the adhesive, the interposer comprising openings to enable the flow of the adhesive through the openings to form adhesive bond areas on one of the substrates that substantially conform to the openings, the bond areas being adjacent to adhesive free areas, the other of the substrate being substantially covered by the adhesive, so that the adhesive bond areas produce regions of reduced adhesive strength to the one substrate compared to the strength of the bond of the adhesive to the other substrate, where one of the substrates comprises a VTM electronic device, and the other of the substrates comprises a heat spreader substrate. The VTM electronic device may comprise a heatable substrate and the other of the substrates comprises a heat spreader substrate; the interposer, a heat conductive material; and the adhesive a TIM. The openings may be sized to produce the bond areas that allow separation of the heat spreader from the VTM without damaging the VTM, and may be sized to produce the bond areas that allow separation of the heat spreader from the VTM without damaging the VTM, where the VTM has a compressive limit of about 15 psi and tensile limit of about 7 psi. In a further embodiment the TIM may comprise a curable or a cured TIM.

In a further embodiment the invention also comprises inter alia an article of manufacture comprising an adhesive on a first substrate and a second substrate, the adhesive securing the first substrate to the second substrate, the adhesive extending in a plane on one side of an interposer, the interposer also extending in the plane and contiguous with the adhesive, the interposer comprising openings through which the adhesive flows and defines adhesive bond areas on one of the substrates, the bond areas substantially conforming to the openings, the bond areas being adjacent to adhesive free areas, the other of the substrate being substantially covered by the adhesive, so that the bond areas comprise regions of reduced adhesive strength to the one substrate compared to the strength of the bond of the adhesive to the other substrate, where one of the substrates comprises a VTM electronic device, and the other of the substrates comprises a heat spreader substrate. The VIM electronic device may comprises a heatable substrate and the other of the substrates comprises a heat spreader substrate; the interposer comprises a heat conductive material; the adhesive comprises a TIM; the openings may be sized to produce the bond areas that allow separation of the heat spreader from the VTM electronic device without damaging the VTM; the openings may be sized to produce the bond areas that allow separation of the heat spreader from the VTM without damaging the VTM, where the VTM has a compressive limit of about 15 psi and tensile limit of about 7 psi; and the TIM comprises a curable or a cured TIM.

Throughout this specification, and abstract of the disclosure, the inventors have set out equivalents, of various materials as well as combinations of elements, materials, compounds, compositions, conditions, processes, structures and the like, and even though set out individually, also include combinations of these equivalents such as the two component, three component, or four component combinations, or more as well as combinations of such equivalent elements, materials, compositions conditions, processes, structures and the like in any ratios or in any manner.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" as applied to any claim or any parameters herein, such as a numerical value, including values used to describe numerical ranges, means slight variations in the parameter or the meaning ordinarily ascribed to these terms by a person with ordinary skill in the art. In another embodiment, the terms "about," "substantial," or "substantially," when employed to define numerical parameter include, e.g., a variation up to five per-cent, ten per-cent, or 15 per-cent, or somewhat higher. Applicants intend that terms used in the as filed or amended written description and claims of this application that are in the plural or singular shall also be construed to include both the singular and plural respectively when construing the scope of the present invention.

All scientific journal articles and other articles, including internet sites, as well as issued and pending patents that this written description or applicants' Invention Disclosure Statements mention, including the references cited in such scientific journal articles and other articles, including internet sites, and such patents, are incorporated herein by reference in their entirety and for the purpose cited in this written description and for all other disclosures contained in such scientific journal articles and other articles, including Internet sites as well as patents and the references cited therein, as all or any one may bear on or apply in whole or in part, not only to the foregoing written description, but also the following claims, and abstract of the disclosure.

Although we describe the invention by reference to some embodiments, other embodiments defined by the doctrine of equivalents are intended to be included as falling within the broad scope and spirit of the foregoing written description, and the following claims, abstract of the disclosure, and drawings.

We claim:

1. A method comprising applying an adhesive to a first substrate and a second substrate to secure said first substrate to said second substrate, said adhesive extending in a plane on one side of an interposer, said interposer also extending in said plane and contiguous with said adhesive, said interposer comprising openings to enable the flow of said adhesive through said openings to form adhesive bond areas on one of said substrates that substantially conform to said openings, said bond areas being adjacent to adhesive free areas, the other of said substrate being substantially covered by said adhesive, so that said adhesive bond areas produce regions of reduced adhesive strength to said one substrate compared to the strength of the bond of said adhesive to said other substrate, where one of said substrates comprises a VTM electronic device, and the other of said substrates comprises a heat spreader substrate.

2. The method of claim 1 wherein said VTM electronic device comprises a heatable substrate and the other of said substrates comprises a heat spreader substrate.

3. The method of claim 2 wherein said interposer comprises a heat conductive material.

4. The method of claim 2 wherein said adhesive comprises a TIM.

5. The method of claim 4 wherein said openings are sized to produce said bond areas that allow separation of said heat spreader from said VTM without damaging said VTM.

6. The method of claim 4 wherein said openings are sized to produce said bond areas that allow separation of said heat spreader from said VTM without damaging said VTM, where said VTM has a compressive limit of about 15 psi and tensile limit of about 7 psi.

7. The method of claim 4 wherein said TIM comprises a curable or a cured TIM.

8. An article of manufacture comprising an adhesive on a first substrate and a second substrate, said adhesive securing said first substrate to said second substrate, said adhesive extending in a plane on one side of an interposer, said interposer also extending in said plane and contiguous with said adhesive, said interposer comprising openings through which said adhesive flows and defines adhesive bond areas on one of said substrates, said bond areas substantially conforming to said openings, said bond areas being adjacent to adhesive free areas, the other of said substrate being substantially covered by said adhesive, so that said bond areas comprise regions of reduced adhesive strength to said one substrate compared to the strength of the bond of said adhesive to said other substrate, where one of said substrates comprises a VTM electronic device, and the other of said substrates comprises a heat spreader substrate.

9. The article of manufacture of claim 8 wherein said VTM electronic device comprises a heatable substrate and the other of said substrates comprises a heat spreader substrate.

10. The article of manufacture of claim 9 wherein said interposer comprises a heat conductive material.

11. The article of manufacture of claim 9 wherein said adhesive comprises a TIM.

12. The article of manufacture of claim 11 wherein said openings are sized to produce said bond areas that allow separation of said heat spreader from said VTM electronic device without damaging said VTM.

13. The article of manufacture of claim 11 wherein said openings are sized to produce said bond areas that allow separation of said heat spreader from said VTM without damaging said VTM, where said VTM has a compressive limit of about 15 psi and tensile limit of about 7 psi.

14. The article of manufacture of claim 11 wherein said TIM comprises a curable or a cured TIM.

\* \* \* \* \*